US006507998B1

(12) United States Patent
Lyford et al.

(10) Patent No.: US 6,507,998 B1
(45) Date of Patent: Jan. 21, 2003

(54) METHOD OF MOUNTING AN ELECTRICAL RECEPTACLE ON A SUBSTRATE

(75) Inventors: J. Steve Lyford, Portland, OR (US); David Rosette, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 481 days.

(21) Appl. No.: 09/035,674

(22) Filed: Mar. 5, 1998

(51) Int. Cl.[7] .............................. H05K 3/34; H05K 3/30

(52) U.S. Cl. .............................. 29/843; 29/842; 29/844; 29/845

(58) Field of Search .......................... 29/843, 739, 842, 29/844, 845, 740, 741

(56) References Cited

U.S. PATENT DOCUMENTS 2,506,047 A * 5/1950 Thomas
4,340,902 A * 7/1982 Honda et al. ................. 357/74
4,384,758 A 5/1983 Lee et al.
4,420,877 A * 12/1983 McKenzie, Jr. .............. 29/739
4,558,514 A * 12/1985 Scantom ...................... 29/838
4,684,055 A * 8/1987 Baer et al. ............... 228/180.1
4,690,484 A * 9/1987 Oba et al. .................... 439/736
4,708,281 A * 11/1987 Nelson et al. ........... 228/180.1
4,726,638 A * 2/1988 Farrar et al. ............ 439/620 R
4,752,027 A * 6/1988 Gschwend ............... 228/180.2
4,755,149 A 7/1988 de Jong et al. ............. 439/248
4,783,906 A * 11/1988 Gingerich et al. ............ 29/827
5,100,339 A 3/1992 Sato et al. .................. 439/354
5,147,221 A 9/1992 Cull et al.
5,230,641 A 7/1993 Wharton
5,381,598 A * 1/1995 Adachi et al. ................ 29/845
5,411,399 A 5/1995 Okuyama et al. ............. 439/67
5,493,098 A * 2/1996 Diederich ................... 219/264
5,651,696 A * 7/1997 Jennison ..................... 439/536
5,678,752 A * 10/1997 Kaminsky et al. .......... 228/223
5,700,159 A * 12/1997 Albeck ....................... 439/571
5,796,073 A * 8/1998 Mattis et al. ............... 219/265

FOREIGN PATENT DOCUMENTS

DE 1095403 2/1959

* cited by examiner

*Primary Examiner*—A. Dexter Tugbang
(74) *Attorney, Agent, or Firm*—William K. Bucher

(57) ABSTRACT

A method of mounting a banana-type electrical receptacle on the substrate includes the steps of placing the electrical receptacle over an aperture formed in the substrate with support ribs formed on the outer surface of the receptacle supporting the receptacle over the aperture. A deformable electrical lead extends from a centrally disposed conductive member making an electrical connection with an electrical contact on the substrate. The electrical lead is affixed to the electrical contact on the substrate and the receptacle is inserted into the aperture crushing or shearing the support ribs and the deforming the electrical lead. Alignment ribs formed on the outer surface of the receptacle have shoulders that contact the substrate for positioning the receptacle in the substrate. The mounting method is compatible with automated soldering processes, such as wave flow soldering.

8 Claims, 7 Drawing Sheets

METHOD OF MOUNTING AN ELECTRICAL RECEPTACLE ON A SUBSTRATE

BACKGROUND OF THE INVENTION

The present invention relates generally to mounting an electrical receptacle on a substrate and more particularly to mounting a banana type receptacle to a circuit board for use in electronic instruments, such as power supplies, hand-held multimeters, oscilloscopes, time domain reflectometers, and the like.

Banana type leads are used in the electronic industry for coupling signals to and from a device under test. A typical banana lead has a single wire terminated at each end with a male banana plug. The banana plug has an elongated conductive probe portion wrapped with a barrel spring, so that the probe portion may be inserted into a banana receptacle in an instrument. The banana receptacle has a conductive sleeve that makes contact with the barrel spring and is surrounded by electrically insulating material on the bottom and outer surface of the conductive sleeve.

Underwriters Laboratories, UL, has established insulation standards for electronic measuring and testing equipment (UL1244) that establishes minimum distances between conductive elements and users for preventing hazardous electrical shocks. Banana type leads that meet this standard have a tubular shaped shroud enclosing the male banana plug. The shroud is a thin walled cylinder of insulating material that provides the minimum distance separation between the male plug, coaxially disposed within the shroud, and the user. The corresponding banana receptacle may include an outer ring of insulating material defining an annular bore coaxial with the insulated conductive sleeve. The shroud of the male plug fits into the annular ring of the receptacle with the male plug making electrical contact with the conductive sleeve.

The conductive sleeve of the banana receptacle generally has electrical leads extending from the sleeve that are exposed at the bottom of the receptacle. The electrical leads are of a length that allows them to be inserted into electrically conductive apertures in a substrate, such as a circuit board. Conductive runs formed on the substrate couple the conductive apertures, and thus the conductive sleeve, to additional circuitry on the substrate. A particular problem with this type of banana receptacle is that the receptacle defines and controls the position of the circuit board in any hand-held electronic instrument design, and thus the overall design of the instrument. For example, the height of the receptacle defines the minimum thickness for the instrument for at least that portion of the instrument where the receptacle is positioned. A more complex shell design having differing surface levels is required if the instruments thickness is to be less than the minimum thickness associated with the receptacle. If, on the other hand, a flat surface shell is chosen, then the internal circuitry design may become more complex and expensive. For example, a custom display having a thickness matching the height of the receptacle may be required if the display is to be mounted directly onto the circuit board. Conversely, if the thickness of the display does not match the receptacle height, then conductive contact elements or cabling would be required for connecting the display to the circuit board which adds cost to the instrument. Likewise, buttons and knobs associated with most hand-held electronic instruments would be affected by the circuit board positioning problem.

An alternative to the above described receptacle-circuit board positioning problem is to remove the receptacles from the main circuit board. The receptacle or receptacles may be individually connected to the main circuit board via soldered wire connections between the receptacle leads and the circuit board. The receptacle or receptacles may also be bolted to the circuit board or instument case with wire leads connecting the receptacle to the circuit board. The receptacle or receptacles may further be placed on a separate circuit board and electrically connected to the main circuit board via soldered wire connections between the leads of the receptacle(s) and the main circuit board or providing some form of interconnect between the boards. While this solution frees designers from the receptacle-circuit board positioning problem, it adds component and manufacturing costs to the instrument.

What is needed is a method of mounting an electrical receptacle, such as a banana receptacle, on a substrate, such as a circuit board, without the limitations of previous receptacle-circuit board designs. The mounting method should not add component or manufacturing costs to the instrument and should be compatible with automated circuit board manufacturing processes. The method should further be flexible to allow for positioning the electrical receptacle at any height within the circuit board. Additionally, the method should also be flexible for permitting the positioning of the circuit board containing the electrical receptacle anywhere within the shell of the instrument.

SUMMARY OF THE INVENTION

Accordingly, it is an object of the present invention to provide a method for mounting an electrical receptacle on a substrate that is compatible with automated circuit board manufacturing processes, such as wave soldering.

It is another object of the present invention to provide a method of mounting an electrical receptacle on a substrate that does not add significant component or manufacturing costs to an electronic measurement instrument, such as a hand-held digital multimeter, time domain reflectometer, oscilloscope, or the like.

It is a further object of the present invention to provide a method for mounting an electrical receptacle on a substrate that allows positioning of substrate within an electronic measurement instrument, such as a hand-held digital multimeter, time domain reflectometer, oscilloscope, or the like.

The method of mounting an electrical receptacle on the substrate includes the steps of placing the electrical receptacle over an aperture formed in the substrate with the receptacle having a body of electrically insulating material partially surrounding an electrically conductive element having a deformable electrical lead with the body of electrically insulating material having support ribs formed on an exterior surface of the insulating body supporting the receptacle over the aperture and the electrical lead making an electrical connection with an electrical contact on the substrate. The electrical lead is affixed to the electrical contact and the receptacle is inserted into the substrate. The affixing step further includes the step of soldering wherein the preferred embodiment of the soldering step further includes the step of wave soldering. The wave soldering step further includes the steps of applying a solder flux to the substrate and heating the substrate prior to the soldering step. The inserting step further includes the step of deforming the electrical lead as the receptacle is inserted into the aperture. The inserting step further includes the steps of shearing or deforming the support ribs and positioning shoulders of alignment ribs, formed on the exterior surface of insulating body, against the substrate. Alternately, the inserting step may further include the steps of deforming the support ribs and positioning shoulders of alignment ribs, formed on the exterior surface of the insulating body, against the substrate.

The objects, advantages and novel features of the present invention are apparent from the following detailed description when read in conjunction with the appended claims and attached drawings.

DETAILED DESCRIPTION OF THE PREFERRED EMBODIMENT

The method of mounting an electrical receptacle on a substrate according to the present invention incorporates an electrical receptacle having a deformable electrical lead or leads and support and alignment ribs formed on the exterior surface of the receptacle. The receptacle is positioned in an aperture formed in a substrate, such as a circuit board or the like. The electrical receptacle is herein described as a banana type receptacle that receives a mating banana type plug. However, the method mounting an electrical receptacle on a substrate according to the present invention is not limited to banana type receptacles and other type of electrical receptacles incorporating the deformable electrical leads and support and alignment ribs may be used without departing from the scope of the appended claims. Below are described a number of embodiments of electrical receptacles incorporating the deformable electrical leads and support and alignment ribs.

Figure 1A:
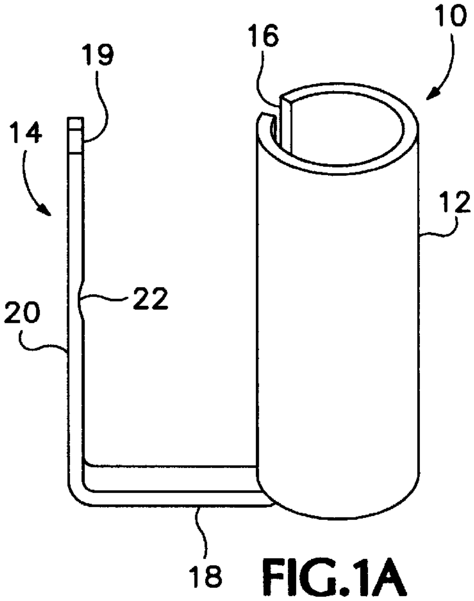
FIGS. 1A–1D are perspective views of four embodiments of an electrically conductive element usable in an electrical receptacle used in the method of mounting an electrical receptacle on a substrate according to the present invention.

Referring to FIG. 1A to FIG. 1D, there are shown perspective views of four embodiments of an electrically conductive element 10 usable in the electrical receptacle used in the method of mounting an electrical receptacle on a substrate according to the present invention. In FIG. 1A, the electrically conductive element 10 includes a conductive member 12 and a deformable electrical lead 14 extending from the conductive member 12. For a banana type electrical receptacle, the conductive member 12 is an elongated tubular shaped conductor. The electrically conductive element 10 is preferably formed using a progressive die in a four slide process that has bending operations in four different directions. Alternately, the electrically conductive element may be formed using a stamping process or other similar type of forming processes. The elongated tubular shaped conductor 12 is shown with a slot 16 formed therein but the conductor 12 may equally be formed as a completely circular conductor without the slot 16. The length of the elongated tubular shaped portion in the range of 0.600 inches with an inside diameter in the range of 0.160 inches. The electrical lead 14 has a first portion 18 that extends outward from the tubular shaped conductor and a second portion 20 that is generally normal to the first portion 18. The second portion 20 is adjacent to and approximately parallel with the tubular shaped conductor 12 and has a tapered end 19 for inserting into an electrically conductive aperture or contact in a substrate, such as a circuit board. The second portion 20 of the electrical lead 14 is shown with an optional coined deformation 22. The function of the coined deformation 22 will described in greater detail below.

Figure 1B:
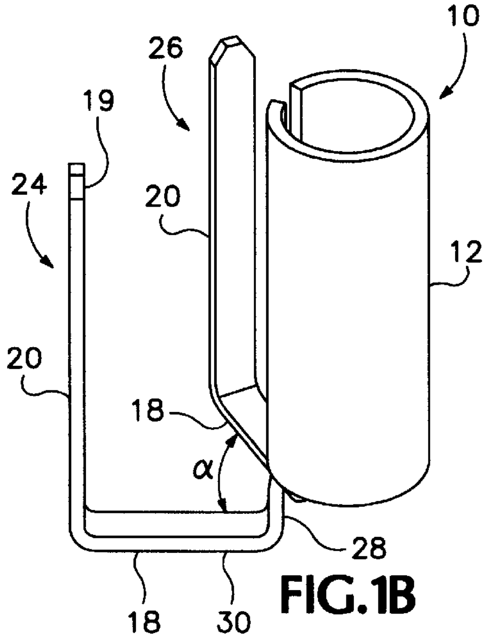

Referring to FIG. 1B, there is shown a perspective view of another embodiment of the electrically conductive element 10 having first and second deformable electrical leads 24 and 26 extending from the tubular shaped conductor 12. The electrical leads 24 and 26 have first and second portions 18 and 20 as in the previously described lead. The first portions 18 of leads 24 and 26 are each configured with a first segment 28 that extends outward from one end of the tubular shaped conductor 12 and are approximately parallel with the tubular shaped conductor 12. A second segment 30 extends away from the tubular shaped conductor 12 and is approximately perpendicular to the first segment 28. The second portions 20 of the electrical leads 24 and 26 are generally normal to the second segments 30 of the first portions 18 and are adjacent to and approximately parallel with the tubular shaped conductor 12. The length of the electrically conductive element 10 in this configuration is in the range of 0.720 inches with the length of the first segments 28 being in the range of about 0.061 inches and the length of the second segments 30 being in the range of about 0.253 inches. The length of the second portions 20 in this configuration are in the range of 0.659 inches. The leads 24 and 26 are angled from each other with the angle a between the leads 24 and 26 being in the range of 63°. The dimensions given for the various elements of the electrically conductive element 10 are examples for a given configuration and other dimensions may be used without departing from the scope of the claimed invention. Further, the configuration of the first portions 18 of the electrical leads 24 and 26 are interchangeable with the first portions 18 of any of the electrical leads in the various embodiments shown in the drawing of the instant application.

Figure 1C:
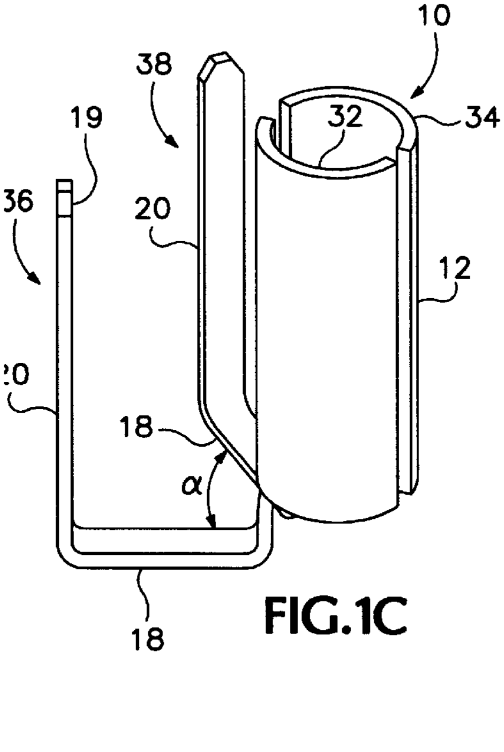
Figure 1D:
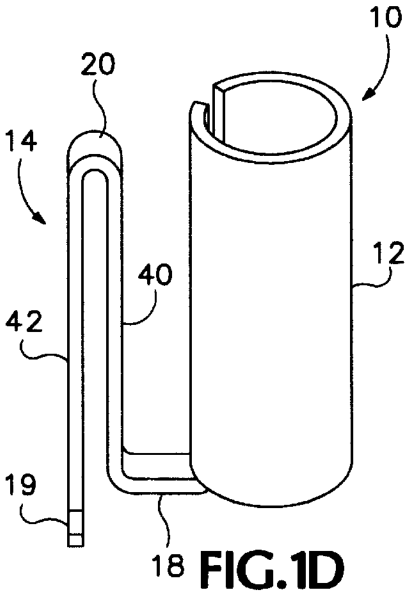

Referring to FIG. 1C, there is shown a perspective view of a further embodiment of the electrically conductive element 10. The conductive member 12 is configured with two opposing elongated arcuate conductors 32 and 34 with each arcuate conductor 32 and 34 having a deformable electrically conductive lead 36 and 38 extending therefrom. Each lead 36 and 38 has first and second portions 18 and 20 with the first portion shown as having the first and second segments 28 and 30. FIG. 1D show a perspective view of still another embodiment of the electrically conductive element 10 having the elongated tubular shaped conductor 12 with the deformable electrically conductive lead 14 extending therefrom. The electrical lead 14 has first and second portions 18 and 20 with the second portion 20 differing from the previously described portions 20 by being U-shaped. The U-shaped second portion 20 has first and second legs 40 and 42 that are approximately parallel with and adjacent to the tubular shaped conductor 12 with leg 42 being disposed further away from the tubular shaped conductor 12 than leg 40. Leg 42 of electrical lead 14 extends past the end of the elongated tubular shaped conductor 12 to allow the tapered end 19 of lead 14 to be inserted into the electrically conductive aperture on the substrate.

The electrically conductive element 10 is preferably formed of nickel plated brass with the brass being in the range of 0.015 inches thick and the nickel plating being in the range of 0.00025 inches thick. The nickel plating is preferably applied using a sulfimate plating process but other plating processes, such as electrolytic plating or electroless plating may be used. The electrical resistance of the plated nickel from the sulfimate process is approximately ten times less than in the other mention processes and provides a better impedance match for high currents coupled through the electrically conductive element 12. Other types of conductive material may be used for forming the electrically conductive element 10 and other types of plating may be used, such as silver or gold, with departing from the scope of the appended claims.

Figure 2A:
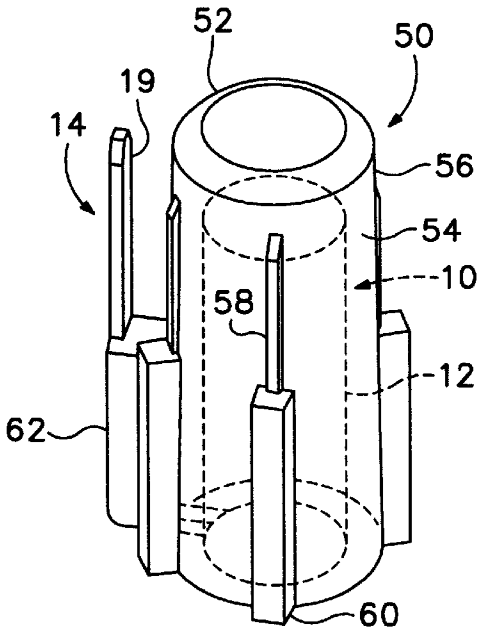
FIGS. 2A–2D are perspective views of four embodiments of the electrical receptacle used in the method of mounting an electrical receptacle on a substrate according to the present invention.

Referring to FIG. 2A to FIG. 2D, there are shown perspective views of four embodiments of an electrical receptacle 50 usable in the method of mounting an electrical receptacle on a substrate according to the present invention. The electrical receptacles 50 in FIGS. 2A–2D use the various electrically conductive elements 10 of FIGS. 1A–1D. In FIG. 2A, a body of electrically insulating material 52 encapsulates the exterior surface 54 of the elongated tubular shaped conductor 12 of the electrically conductive element 10. The encapsulating insulating material 52 generally extends past the top of the conductive element 10 producing a recessed conductor 10 within the body of electrically insulating material 52. The body of electrically insulating material 52 has an exterior surface 56 on which is formed support ribs 58 and alignment ribs 60. The support ribs 58 and the alignment ribs 60 are generally evenly spaced about the periphery of the insulating body 52 and are axially aligned with the tubular shaped conductor 12. In the configurations shown in FIGS. 2A–2D, the ribs 58 and 60 are vertically positioned on the exterior surface 56 with one rib being above the other. The support ribs 58 are positioned on the insulating body 52 toward the tapered end 19 of lead 14. Alternately, the ribs 58 and 60 may be offset from each other on the exterior surface 58. A tooling rib 62 may be formed on the exterior surface 58 of the insulating body 52 adjacent to the deformable electrical lead 14 for tooling purposes. The rib 62 is sized wider than the width of the lead 14 due to the dimensional tolerances of the insulating body 52 being more exact than the dimensional tolerances of the lead 14.

Figure 2B:
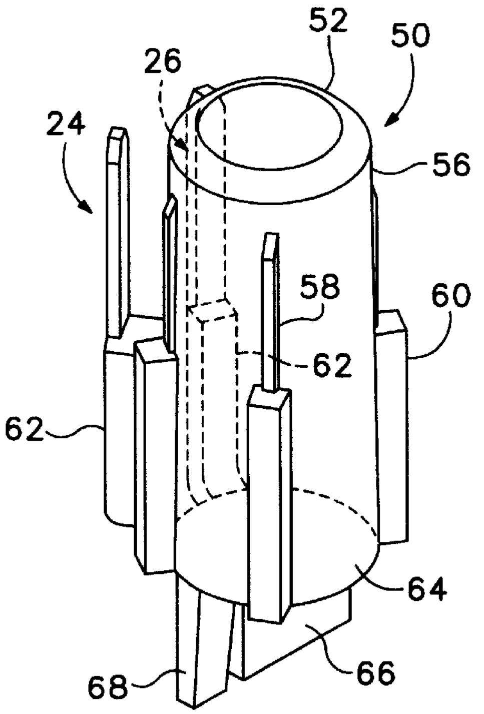

FIG. 2B shows a perspective view of another embodiment of the electrical receptacle 50 having the body of electrically insulating material 52 encapsulating the electrically conductive element 10 of FIG. 1B. The electrical receptacle 50 has the deformable electrical leads 24 and 26 extending through the insulating body 52 with the tooling ribs 62 being formed on the exterior surface of the insulated body 52 adjacent to the leads 24 and 26. The support ribs 58 and alignment ribs 60 are formed on the exterior surface 56 of the insulating body. The body of insulating material 52 further includes a base 64 from which the encapsulating insulating material extends. Additionally, the insulating body 52 include a flange 66 extending from the base 64 in a direction opposite the encapsulating material. The bottom of the flange 66 abuts against the electronic instrument case incorporating the electrical receptacle 50 providing support for the electrical receptacle 50 during insertion of the male banana leads into the receptacle 50. The flange 66 may include a slot 68 for the routing of wiring in the electronic instrument.

Figure 2C:
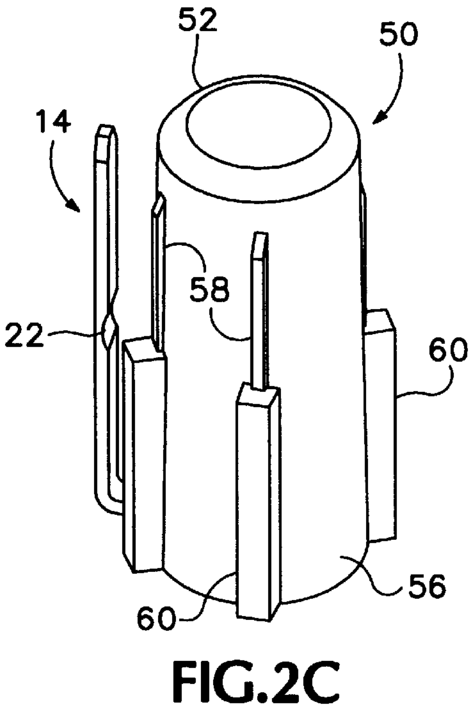
Figure 2D:
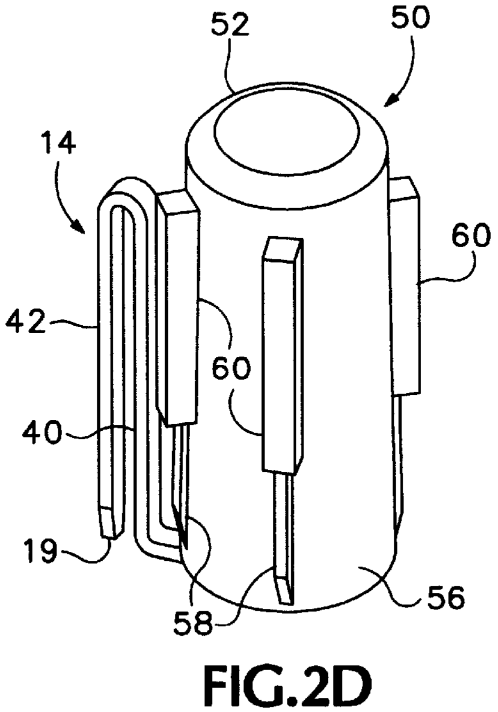

FIG. 2C shows a perspective view of a further embodiment of the electrical receptacle 50 having the body of electrically insulating material 52 partially encapsulating the electrically conductive element 10 of FIG. 1A. The electrical receptacle 50 has deformable electrical lead 14 with the coined deformation 22. The exterior surface 56 of the insulating body has the support ribs 58 and alignment ribs 60 formed thereon. FIG. 2D show a perspective view of still another embodiment of the electrical receptacle 50 having the body of electrically insulating material 52 partially encapsulating the electrically conductive element 10 of FIG. 1D. Legs 40 and 42 of the U-shaped second portion 20 of electrical lead 14 are approximately parallel with and adjacent to the insulating body 52 with leg 42 being disposed further away from the insulating body 52 than leg 40. Leg 42 extends past the end of the insulating body 52 to allow the inserting of the tapered end 19 of lead 14 into the electrically conductive aperture on the substrate. The support ribs 58 and alignment ribs 60 on the exterior surface 56 of the insulating body 52 are inverted from the previous embodiments to correspond with the positioning of the tapered end 19.

The body of insulating material 52 is preferably formed of a high temperature nylon, referred to as Staynl, or other types of formable high temperature insulating materials. A particular type of high temperature nylon is TW341, manufactured and sold by General Polymers, a division of Ashland Chemical, Dublin, Ohio. The use of a high temperature material for the body of insulating material 52 allows the electrical receptacle 50 to be affixed to a substrate using an automated soldering processes, such as wave soldering.

Figure 3:
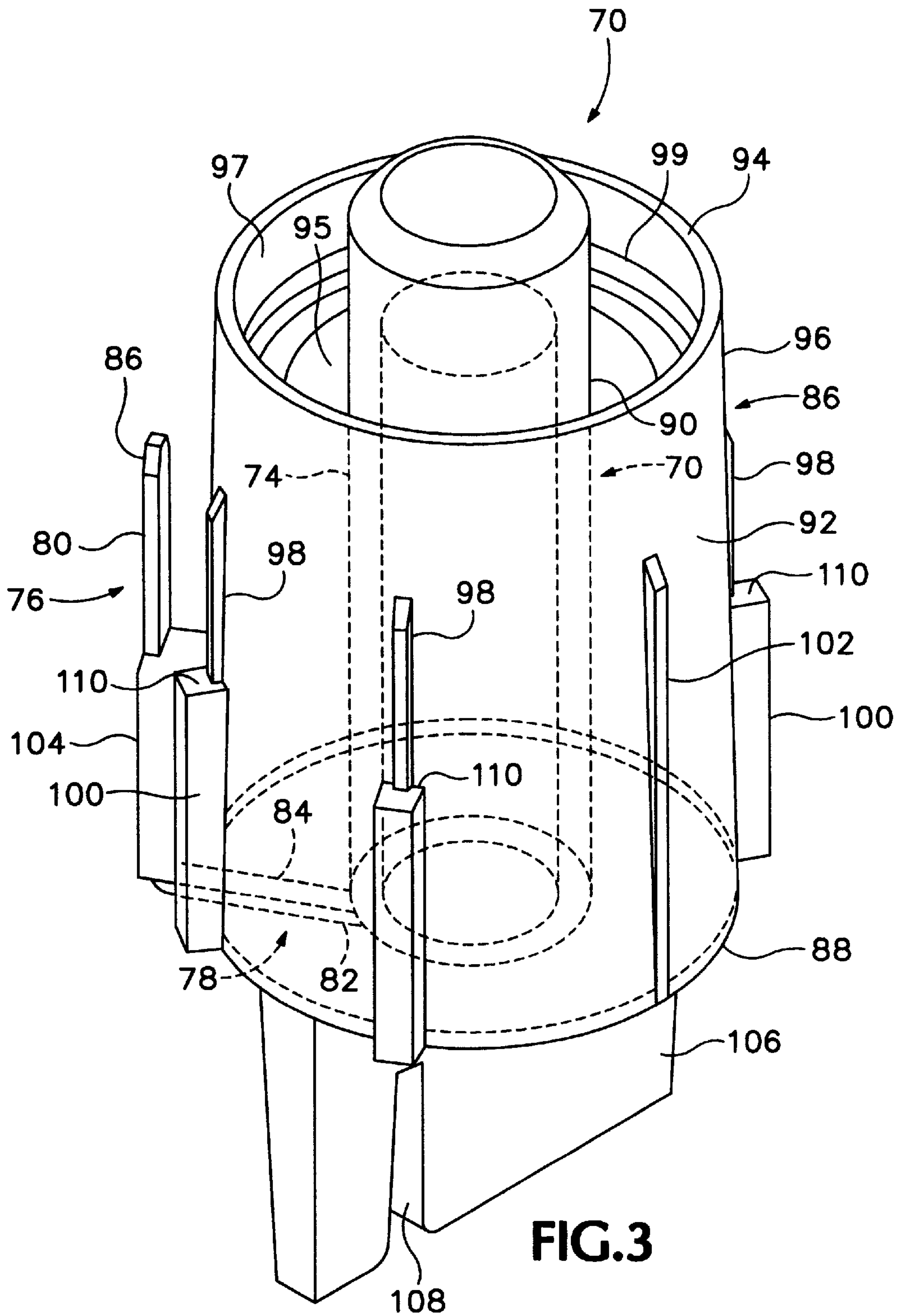
FIG. 3 is a perspective view of a first commercial embodiment of the electrical receptacle used in the method of mounting an electrical receptacle on a substrate according to the present invention.

Referring to FIG. 3, there is shown a first commercial embodiment of an electrical receptacle 70 usable in the method on mounting an electrical receptacle on a substrate according to the present invention. The electrical receptacle 70 has an electrically conductive element 72 having a conductive member 74 centrally disposed within the receptacle 70. In this embodiment, the conductive member 74 is configured as an elongated tubular shaped conductor having a deformable electrical lead 76 extends from the tubular shaped conductor 74. The electrical lead 76 has a first portion 78 that extends outward from the tubular shaped conductor 74 and a second portion 80 that extends from the first portion and is adjacent to and approximately parallel with the tubular shaped conductor 74. The first portion of the electrical lead 76 has a first segment 82 that extends outward from one end of the tubular shaped conductor 74 and is parallel with the conductor 74. A second segment 84 extends approximately perpendicular from the first segment 82. The second portion 80 of lead 76 is tapered at end 86 for insertion into a conductive aperture or contact of a substrate, such as a circuit board. Any of the various electrically conductive elements 10 previously described in relation to FIGS. 1A–1D may used for the electrically conductive element 72 in the embodiment of FIG. 3 without departing from the scope of the appended claims.

The electrical receptacle 70 has a body of insulating material 86 that includes a base 88 with the insulating material 90 extending from the base 88 and encapsulating the elongated tubular shaped conductor 74 about its exterior surface 92. In the preferred commercial embodiment, the encapsulating material 90 has a generally smooth surface and extends beyond the top of the tubular shaped conductor 74 producing a recessed conductor. An outer ring of insulating material 94 extends from the base 88 producing an interposing annular bore 95 between the insulated conductor 74 and the outer ring 94. The outer ring 94 has a thinned inner surface 97 near the top forming a shoulder 99. A corresponding ring formed on the inside of the case of the electronic instrument mates with thinned inner surface 97 and the shoulder 99 to form a seal between the electrical receptacle and the electronic instrument case. The outer ring of insulating material 94 has an exterior surface 96 on which is formed support ribs 98 and alignment ribs 100. The support and alignment ribs 98 and 100 are vertically positioned on the exterior surface 96 of the outer ring 94 with the support ribs 98 being above the alignment ribs 100. Additional support ribs 102 may be formed on the exterior surface 96. Alternately, the ribs 98 and 100 may be offset from each other on the exterior surface 96. A tooling rib 104 may be formed on the exterior surface 96 of the outer ring 94 adjacent to the deformable electrical lead 76 for tooling purposes. The rib 104 is sized wider than the width of the lead 76 due to the dimensional tolerances of the insulating body 86 being more exact than the dimensional tolerances of the lead 76. Extending from the base 88 in a direction opposite the encapsulating material 90 and the outer ring 94 is a optional flange 106. The bottom of the flange 106 abuts against the electronic instrument case incorporating the electrical receptacle 70 providing support for the electrical receptacle 70 during insertion of the male banana leads into the receptacle 70. The base 88 may also be used to support the electrical receptacle 70 within the electronic instrument. The flange 106 may include a slot 108 for the routing of wiring in the electronic instrument.

The overall length of the electrical receptacle 70 in this embodiment is in the range of 1.200 inches with a diameter to the exterior surface 96 of the outer ring 94 in the range of 0.535 inches. The length of the encapsulating material 90 surrounding the elongated tubular shaped conductor 74 in the range of 0.76 inches with a diameter in the range of 0.251 inches. The diameter of the annular bore at the thinned inner surface 97 is in the range of 0.474 inches with the shoulder 99 being 0.116 inches from the top of ring 94. The diameter of the annular bore is in the range of 0.379 inches. The support ribs 98 start approximately 0.195 inches down from the top of the outer ring 94 and have a length of approximately 0.247 inches. The ribs 98 are approximately 0.162 inches wide and have an angled top surface that extends outward from the surface 96 approximately 0.017 inches. The body of the rib tapers from the top surface to thickness of approximately 0.012 inches at the alignment ribs 100. The additional support rib 102 starts at the same distance from the top of ring 94 as the ribs 98 and has the same angled top surface and, width and thickness at the top surface as the rib 98. Rib 102 tapers from the top surface to the base of the receptacle where the rib 102 is essentially flush with the surface 96.

The alignment ribs 100 start approximately 0.442 inches down from the top of the ring 94 and have a length of 0.277 inches from the end of ribs 98 to the bottom of the ring 94. The ribs 100 have a width of approximately 0.045 inches and extend outward from the surface 96 approximately 0.034 inches forming a shoulder 110. The tooling rib 104 is approximately 0.245 inches long, has a width of approximately 0.080 inches, and extends outward from the surface 96 approximately 0.075 inches. The flange 106 extends down from the base 88 approximately 0.358 inches and has a thickness of approximately 0.070 inches.

The electrical receptacle 70 is preferably formed using an injection molding process where the body of insulating material 86 is formed around the electrically conductive element 74. The elongated tubular shaped conductor 74 is placed on a pin in an injection molding tool. The tool is closed and the melted insulating material is injected into the tool to form around the conductive element 74 and conform to the pattern of the tool. The insulating material solidifies and tool is opened for the removal of the completed part and the placement of the next conductive element into the tool. The injection molding process forms an electrical receptacle 70 where the base 88 is integrally formed with the encapsulating material around the conductor 74 and the outer ring 94. The flange 106, if included with the receptacle 70, is integrally formed with the base.

Figure 4:
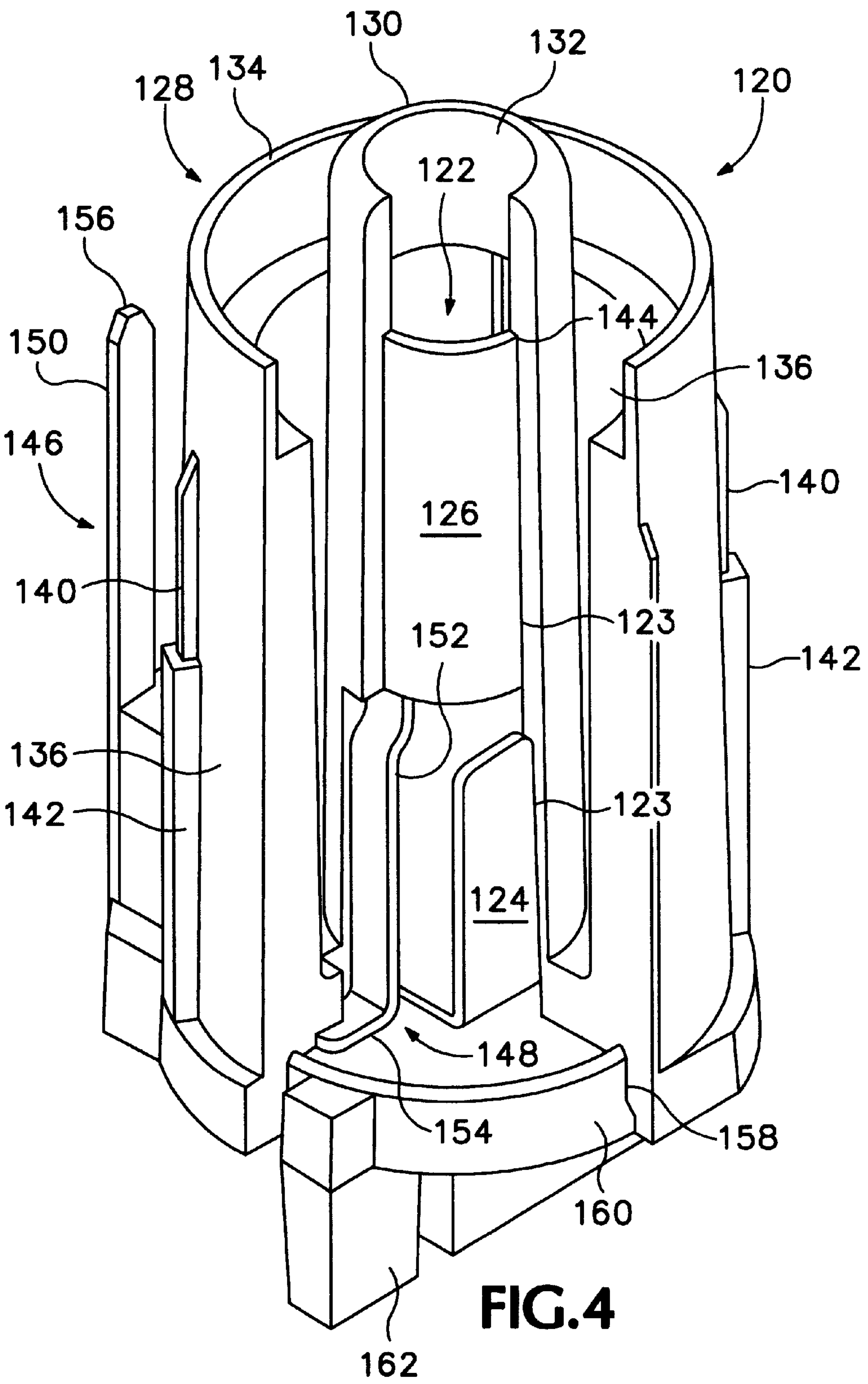
FIG. 4. is a perspective view of a second commercial embodiment of the electrical receptacle used in the method of mounting an electrical receptacle on a substrate according to the present invention.

FIG. 4 is a second commercial embodiment of an electrical receptacle 120 usable in the method of mounting an electrical receptacle on a substrate according to the present invention. The overall dimensions for the electrical receptacle 120 are similar to that of receptacle 70. The electrical receptacle 120 is configured with an electrically conductive element 122 having conductive member 123 that includes a flexible spring conductor 124 axially aligned with and electrically separated from an elongated tubular shaped conductor 126. The conductive member 123 is surrounded by a body of insulating material 128 having a central protrusion 130 of insulating material with a central bore 132 that encapsulates the conductive member 123. An outer ring of insulating material 134 surrounds the central protrusion 130 forming an annular bore 136 between the protrusion 130 and the outer ring 134. The outer ring 134 has an exterior surface 138 on which are form support ribs 140 and alignment ribs 142. The central bore 132 has first and second diameters forming a shoulder 144 on the interior surface of the central protrusion. The elongated tubular shaped conductor 126 is closely received within the bore 132 and abuts the shoulder 144.

The flexible spring conductor 124 has a deformable electrical lead having a first portion extending outward from the spring conductor 124 through the insulating material 128 and a second portion that is approximately parallel with the tubular shaped conductor 126 and adjacent to the outer ring 134. The elongated tubular shaped conductor 126 has a deformable electrical lead 146 having a first portion 148 and a second portion 150. The first portion 148 has a first segment 152 that extends from one end of the conductor 126 and is approximately parallel with the conductor 126. A second segment 154 extends approximately at a right-angle from the first segment 152 through the body of insulating material 128. The second portion 150 has a tapered end 156 for inserting into a conductive aperture in a circuit board.

The body of insulating material 128 is formed with a recess 158 at one end for receiving a separately formed base 160. The base 160 is affixed in the recess 158 by sonic welding or other affixing means, such as gluing with adhesives, snap fitting the parts, or the like. The base 160 includes a flange 162 having the same function as the flange 106 in the previous embodiment. Preferably, the flange 162 is integrally formed with the base 160 but may be formed separately and affixed to the base 160 by sonic welding, gluing or other types of affixing means.

Figure 5:
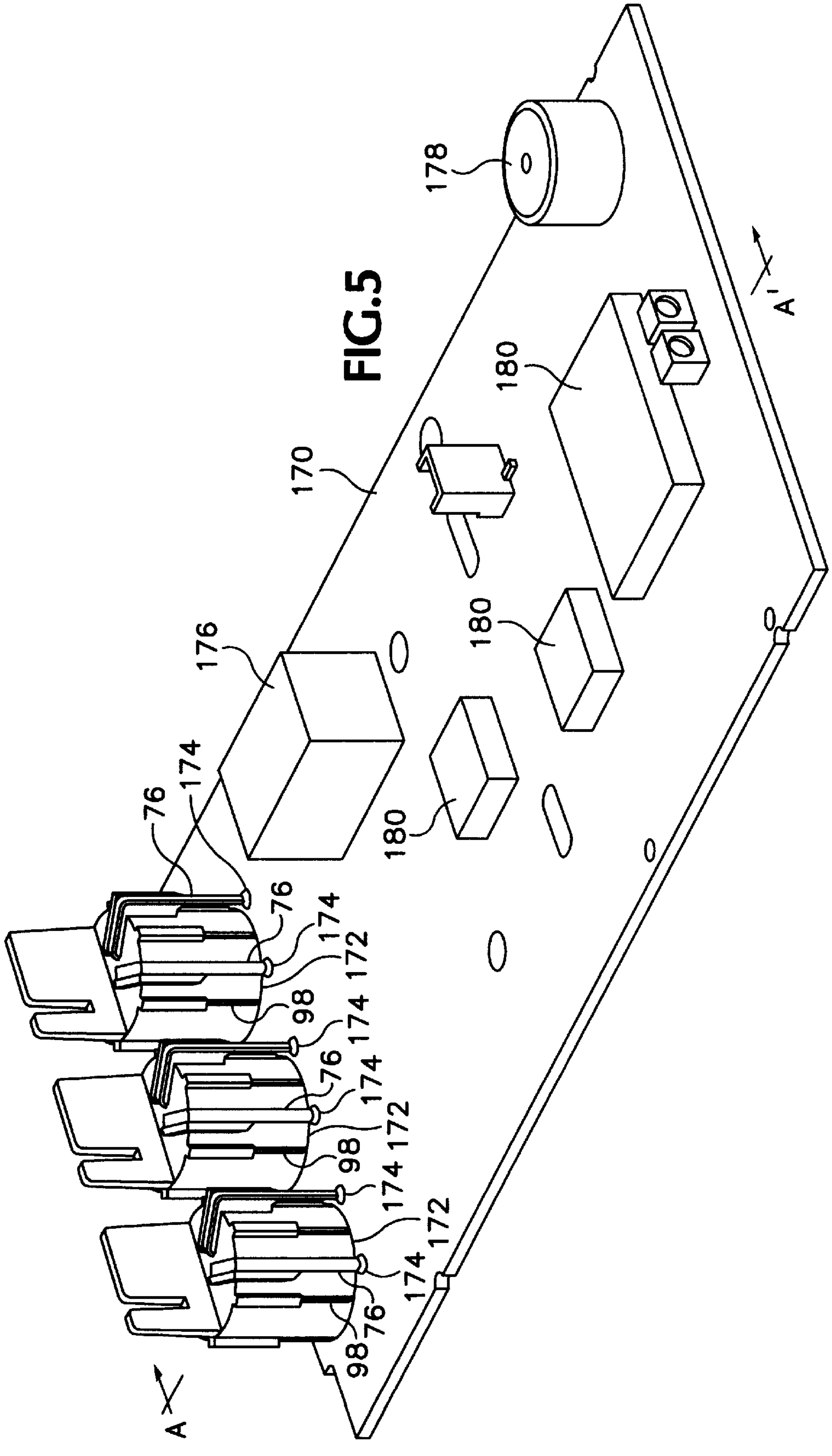
FIG. 5 is a perspective view of electrical receptacles mounted on a circuit board in the method of mounting an electrical receptacle on a substrate according to the present invention.

The dimensions given above are for the described commercial embodiments of the electrical receptacle and other dimensions may be used based on the particular design requirements. For example, the structure of the electrical receptacle 70 is designed so that the receptacle can be mounted into a substrate, such as a circuit board, using automated soldering processes, such as wave soldering. Referring to FIG. 5, there is shown a perspective view of a circuit board 170 having apertures 172 formed therein for receiving electrical receptacles 70. The circuit board 170 has a thickness in the range of 0.062 inches. The support ribs 98 of the electrical receptacles 70 engage the circuit board 170 and support the receptacle in the apertures 172. The deformable electrical leads 76 of the receptacles 70 are inserted through conductive apertures 174 or contacts formed in the circuit board 170. Approximately 0.050 inches of the leads 76 are exposed on the reverse side of the board. Additional electronic components are mounted on the circuit board for the wave soldering process, such as a relay 176 and a tone generator 178. Other electronic components previously mounted on the circuit board using a reflow soldering process, such a integrated circuits 180, are representatively shown on the circuit board. A feature of the electrical receptacle mounting method according to the present invention is that the components are mounted on the opposite side of the circuit board 170 that will face up in the completed electronic instrument. This allow the circuit board to be positioned closer to the front of the instrument case. This, in turn, reduces the design complexity of the instrument with respect to instrument buttons and rotary switches as well as the display.

Figure 6:
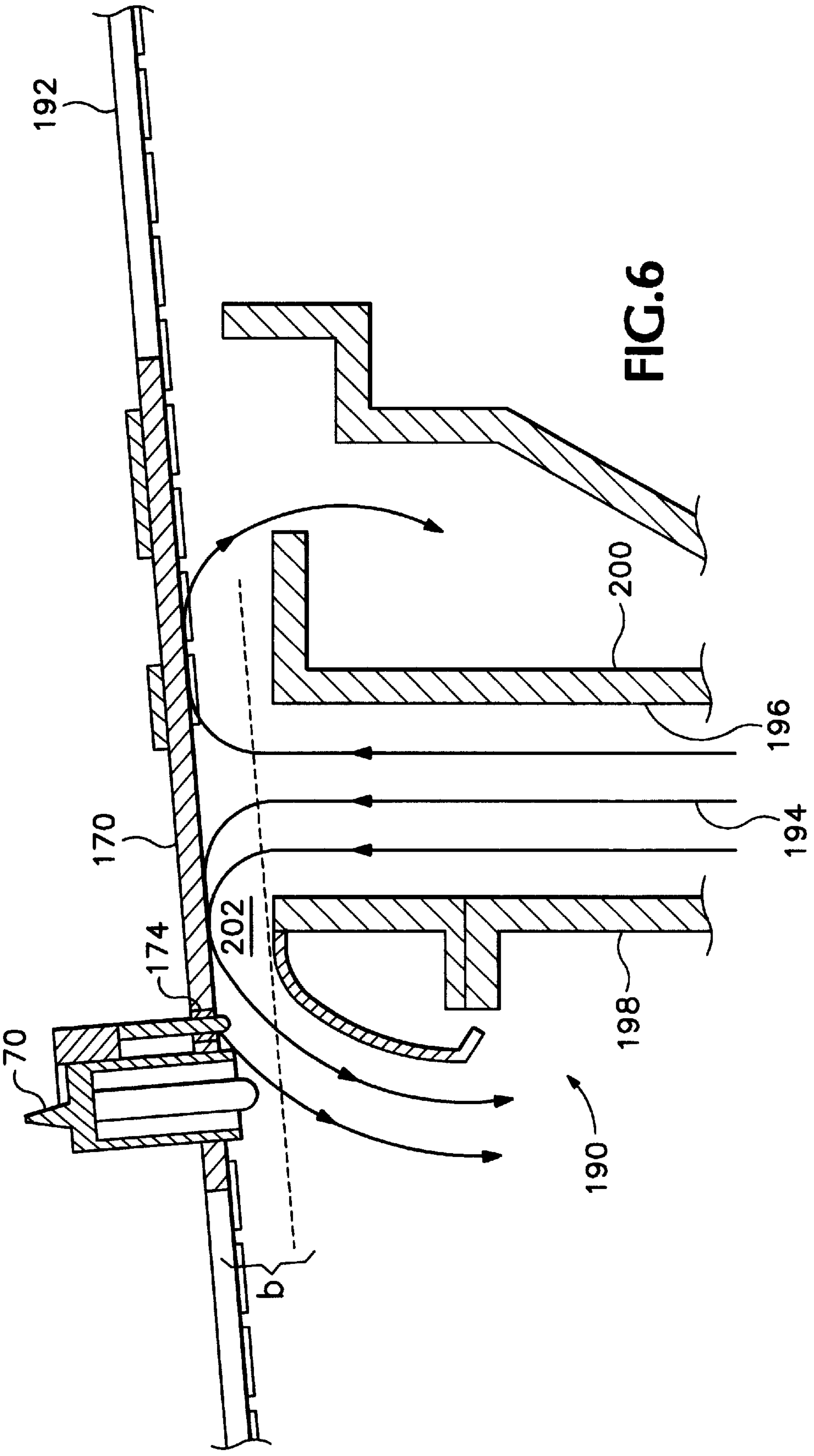
FIG. 6 is a side sectional view of the electrical receptacles mounted on a circuit board and passing through a wave flow soldering apparatus used in the method of mounting an electrical receptacle on a substrate according to the present invention.

Referring to FIG. 6, there is shown a side sectional view, alone line A–A', of the circuit board 170 passing though a portion of a wave solder machine 190, such as an Ultrapak 450, manufactured and sold by Electrovert, Camdonton, Mo. The circuit board 170 travels through the solder machine on a conveyer system 192. Initially, the circuit board passes over a solder flux station in the wave solder machine 190 where flux is applied to the soldering points on the board 170, such as the conductive apertures 174 and the ends of leads 76. The board is then heated prior to passing over the solder wave. The liquid solder 194 is pumped through a 196 channel formed by baffle walls 198 and 200 and creates the solder wave 202 at the top of the walls. The circuit board 170 passes over the solder wave 202 with the wave washing against the underside of the circuit board 170 and depositing solder on the soldering points and affixing the electrical leads 76 to the contacts 174 on the circuit board 170. A weight of some form, such as a bar, may be placed on the tops of the electrical receptacles 70 to assure that leads or the receptacles themselves are not pushed out of their respective apertures 174 by the pressure of the solder wave 202. The board 170 then passes through a washing station where the excess solder flux is removed from the board 170.

The distance between the bottom of the circuit board 170 and the baffle walls 196, 200 in the Ultrapak 450 wave solder machine 190 is approximately 0.3125 inches as represent by the distance marked by "b" in the figure. The distance "b" along with the thickness of the circuit board 170 are two of the determining factors for the various dimensions of the electrical receptacle 70. For example, the length of the second portion 80 of leads 76 in combination with the start of the support ribs 96 on the receptacle 70 should be such that the ends of the electrical leads 76 are exposed on the underside of the circuit board 170 a standard 0.050 inches. Further, to allow the receptacle 70 to pass over the baffle walls 198, 200 of the solder flow machine 190, the maximum distance that the receptacle 70 can be exposed on the underside of the circuit board 170 is less than 0.3125 inches. For a 0.062 inch thick circuit board, this would mean that the end of the receptacle 70 exposed on the underside of the board 170 cannot be more than 0.3745 inches from the start of the support ribs 98. Depending on the thickness of the circuit board and the type of wave solder machine being used, the dimensions for the electrical receptacle 70 will vary to meet the requirements for clearance and lead placement.

Figure 7:
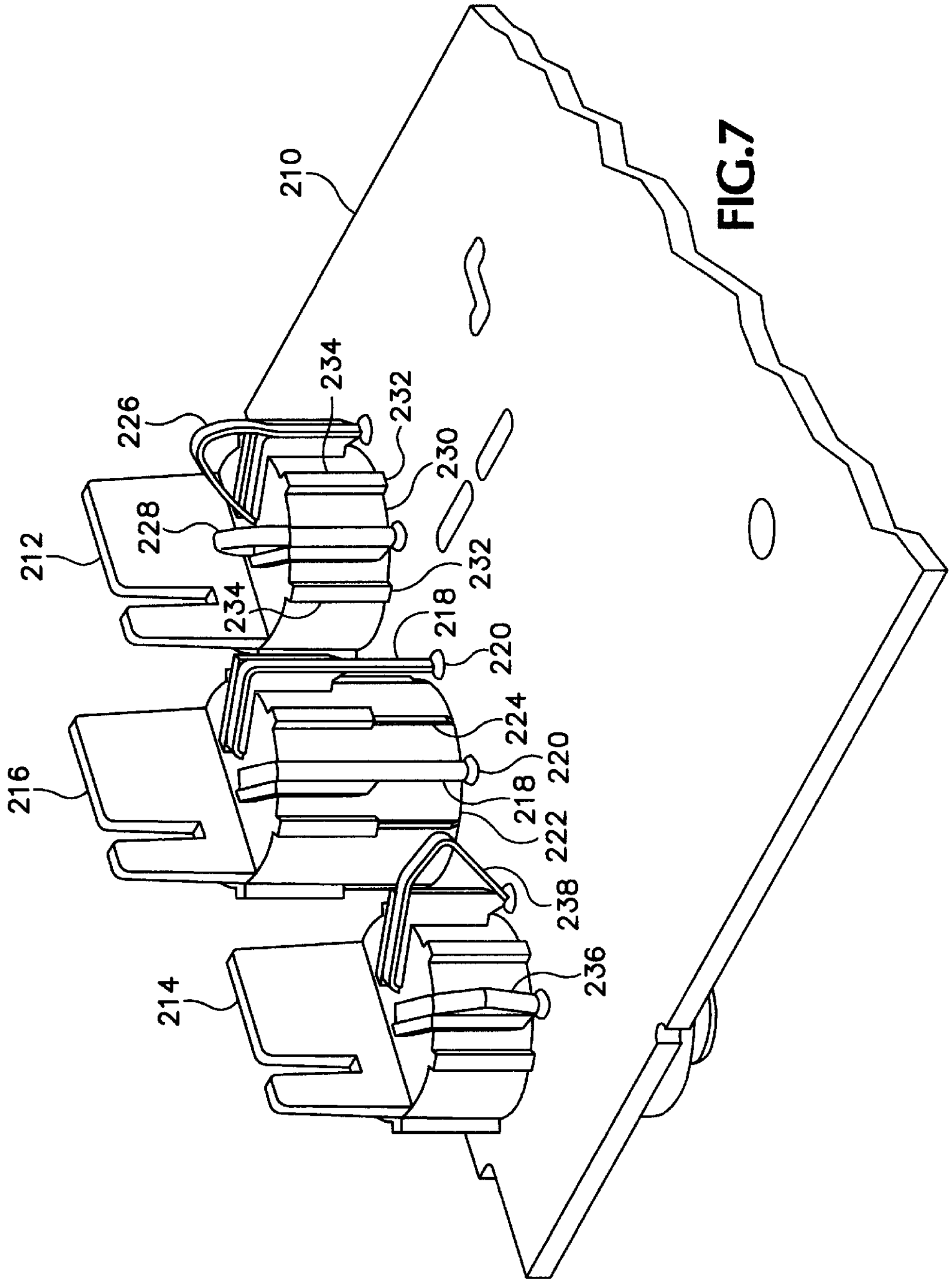
FIG. 7 is a perspective view of a circuit board showing electrical receptacles inserted in the circuit board in the method of mounting an electrical receptacle on a substrate according to the present invention.

Referring to FIG. 7, there is shown a perspective view of a circuit board 210 showing electrical receptacles 212 and 214 inserted into the circuit board 210. Electrical receptacle 216 is shown mounted on the circuit board 210 and ready for position in the board 210. The deformable electrical leads 218 of the receptacle 216 have been soldered to the electrical contacts 220 and the receptacle is supported over the aperture 222 in the circuit board 210 by the support ribs 224 on the receptacle 216. Referring to the inserted electrical receptacle 212, downward pressure applied to the receptacle 212 causes the deformable electrical leads 226 and 228 to bend upward. The support ribs on the receptacle 212 are sheared or crushed by the circuit board aperture 230 as the receptacle 212 is pushed into the aperture 230. Continued downward pressure on the receptacle 212 brings shoulders 232 on alignment ribs 234 into contact with the circuit board 210. The receptacle 212 is aligned in the circuit board 210 when the shoulders 232 of the alignment ribs 234 are positioned against the circuit board 210. The inserted electrical receptacle 214 shows an alternative bending pattern for deformable electrical leads 236 and 238. Previously, the deformable electrical leads were described as having a coined deformation on the second portion of the leads. The coined deformation provides a bending point for allowing the leads 236 and 238 to flex outward from the receptacle 214 instead of bending upward.

A method has been described for mounting an electrical receptacle on a substrate where the electrical receptacle has a deformable electrical lead extending from the receptacle for making an electrical connection to the substrate. A body of electrically insulating material partially surrounds a conductive member of an electrically conductive element that is connected to the electrical lead with the insulating body having support ribs and alignments. The steps of mounting the electrical receptacle include placing the electrical receptacle over an aperture formed in the substrate with the support ribs supporting the receptacle over the aperture and the electrical lead making an electrical connection with an electrical contact on the substrate. The electrical lead is affixed to the electrical contact and the receptacle is inserted into the aperture. The affixing step further includes the step of soldering where the preferred soldering method is wave soldering. The wave soldering step further includes the steps of applying a solder flux to the circuit board and heating the board prior to the wave soldering and washing the board after the soldering. The method of mounting the electrical receptacle according to the present invention may also be implemented using hand soldering where the receptacle is placed in the aperture on the circuit board, the electrical leads are affixed to the electrical contacts of the circuit board by hand soldering, and the receptacle is inserted into the circuit board. The inserting step further includes the steps of deforming the electrical leads and shearing or crushing the support ribs as the receptacle is inserted into the circuit board. The inserting step also includes the step of positioning the shoulders of the alignment ribs against the substrate. These and other aspects of the present invention are set forth in the appended claims.

What is claimed is:

1. A method of mounting an electrical receptacle on a substrate having an aperture formed therein wherein the electrical receptacle has an electrically conductive element having a deformable electrical lead with a portion of the electrically conductive element being surrounded by a body of electrically insulating material with the body of electrically insulating material having support and alignment ribs formed on an exterior surface thereof and the deformable electrical lead extending from the receptacle for making an electrical connection to the substrate comprising the steps of:

placing the electrical receptacle over the aperture with the support ribs supporting the receptacle over the aperture and the electrical lead making the electrical connection with an electrical contact of the substrate;

affixing the electrical lead to the electrical contact; and inserting the receptacle into the aperture.

2. The method of mounting an electrical receptacle on a substrate as recited in claim 1 wherein the affixing step further comprises the step of soldering.

3. The method of mounting an electrical receptacle on a substrate as recited in claim 2 wherein the soldering step further comprising the step of wave soldering.

4. The method of mounting an electrical receptacle on a substrate as recited in claim 3 wherein the wave soldering step further comprising the steps of:

applying a solder flux to the substrate; and heating the substrate prior to the wave soldering step.

5. The method of mounting an electrical receptacle on a substrate as recited in claim 3 wherein the soldering step further comprises the step of washing the substrate subsequent to the soldering step.

6. The method of mounting an electrical receptacle on a substrate as recited in claim 1 wherein the inserting step further comprises the step of deforming the electrical lead as the receptacle is inserted into the aperture.

7. The method of mounting an electrical receptacle on a substrate as recited in claim 6 wherein the alignment ribs have shoulders extending from the body of electrically insulating material and the inserting step further comprises the steps of deforming the support ribs and positioning the shoulders of the alignment ribs against the substrate.

8. The method of mounting an electrical receptacle on a substrate as recited in claim 6 wherein the alignment ribs have shoulders extending from the body of electrically insulating material and the inserting step further comprises the steps of shearing the support ribs and positioning the shoulders of the alignment ribs against the substrate.

* * * * *